United States Patent [19]

Hause et al.

[11] Patent Number: 4,578,859

[45] Date of Patent: Apr. 1, 1986

[54] IMPLANT MASK REVERSAL PROCESS

[75] Inventors: Frederick N. Hause, Palm Bay; John T. Gasner, Melbourne, both of Fla.

[73] Assignee: Harris Corporation, Melbourne, Fla.

[21] Appl. No.: 643,362

[22] Filed: Aug. 22, 1984

[51] Int. Cl.[4] ............... H01L 21/22; H01L 29/78; H01L 21/265
[52] U.S. Cl. .................................. 29/578; 29/571; 29/576 B; 148/1.5; 148/187; 357/42
[58] Field of Search ............. 29/578, 576 B, 571; 148/1.5, 187; 357/42

[56] References Cited

U.S. PATENT DOCUMENTS

| | | | |
|---|---|---|---|
| 4,224,733 | 9/1980 | Spadea | 29/571 |
| 4,253,888 | 3/1981 | Kikuchi | 148/187 |
| 4,376,658 | 3/1983 | Sigusch | 148/1.5 |
| 4,385,947 | 5/1983 | Halfacre et al. | 148/187 |
| 4,411,058 | 10/1983 | Chen | 29/571 |
| 4,435,896 | 3/1984 | Parrillo et al. | 29/571 |
| 4,468,852 | 9/1984 | Cerofolini | 29/571 |
| 4,480,375 | 11/1984 | Cottrell et al. | 29/576 B |
| 4,507,847 | 4/1985 | Sullivan | 29/576 B |
| 4,509,991 | 4/1985 | Taur | 148/1.5 |

OTHER PUBLICATIONS

"Quadruple-Well CMOS-A VLSI Technology"; John Chen; *IEDEM* 82, pp. 791–792.

"A Simple Metal Lift-Off Process (For 1 Micron Al/5% Cu Lines*)"; Tom Batchelder; *Solid State Technology*; Feb. 1982; pp. 111–114.

"Lift-Off Metallization of Sputtered Al Alloy Films"; T. Sakurai et al., *J. Electrochem. Soc.;* vol. 126, No. 7; Jul. 1979; pp. 1257–1260.

"Single-Step Optical Lift-Off Process"; M. Hatzakis; *IBM J. Res. Develop.*, vol. 24, No. 4; Jul. 1980; pp. 452–460.

*Primary Examiner*—Upendra Roy
*Attorney, Agent, or Firm*—Barnes & Thornburg

[57] ABSTRACT

A reverse mask is formed after the first ion implantation step by applying a second masking material to at least fill the opening in the first mask layer and removing the second mask material to reveal at least a portion of the first mask layer. The first mask layer is then selectively removed with any superimposed second mask layer material thereon. This forms a truly inverse mask. Second conductivity impurities are then introduced through the inverse mask to form self-aligned complementary wells in a substrate.

28 Claims, 18 Drawing Figures

IMPLANT MASK REVERSAL PROCESS

BACKGROUND AND SUMMARY OF THE INVENTION

The present invention relates generally to integrated circuits and method of manufacturing and more specifically to a method of manufacturing self-aligned junction isolated complementary regions or wells in an integrated circuit.

The industry is constantly working toward increasing the device density on a wafer or chip. The number of devices that can be placed on a chip is limited by the size of the device and the electrical interaction. These place restraints on the spacing between devices. Further limitation are in the processing steps dealing with photolithography and the ability to form doped regions of the controllable size and impurity concentration.

In CMOS integrated circuit processes, where complementary transistors are the basic building blocks of complex circuits, doping concentration backgrounds of both N and P backgrounds need to exist for fabricating the transistors. Previous processes used only one photolithographic mask to implant an impurity to change impurity type in the silicon, or other type of substrate, for the well of one transistor while the background doping of the substrate would be the well of the complementary transistor.

In more advanced processes, devices are more sensitive to their well dopings and profiles so that two implant masks are needed to tailor the wells of each type of transistor. When a second masking step is used for twin wells, alignment tolerance must be included to prevent overlapping of implants. As illustrated in FIG. 1, the mask, which is the second mask, extends past the edges of the first P type impurity well and, thus, is greater than the opening in the first mask of FIG. 1. The size of the second mask is limited by the lithographic tolerances since overlap of the P- and N- regions is very undesirable.

The prior art has attempted to use silicon nitride mask and local oxidation to form a pair of masks using a single photolithographic process. In this process the first mask is silicon nitride and the second mask is the thick local oxidation which is an attempt at an inverse image of the silicon nitride. As is well known in the art, a bird's beak is formed, thus diminishing the accuracy of the mask alignments. Similarly, because of the high temperature cycle to form the local oxidation, undesirable redistribution of the first implant also results. Thus, this process has been found undesirable.

One technique to form a substantially reversed mask using one photolithographic step is to apply a thin metal layer over a thick photosensitive resist layer and selectively remove the photoresist layer with the thin metal layer thereon. Such processes involve a photoresist pattern with aspect ratio and treatment to the surface of the photoresist to give it an overhanging or undercut profile as a first mask. When metal as a second mask is deposited over this structure it will not be continuous over the step or a microcrack over the step will result. The discontinuity of metal or microcrack allows a wet chemical to attack the photoresist and lift off the unwanted metal. Because of the difference in height between the thickness of the metal layer and the photosensitive resist layer, a clean edge is not formed and, thus, some misalignment must be accounted for. Prior techniques generally use channel stops to account for any misalignment. This additional area occupies valuable space. A portion of the reverse masking step is illustrated in FIG. 2 after the implant usihg the first mask and the application of the thin second mask layer prior to the removal of the first mask layer and the superimposed second mask material.

Thus, it is an object of the present invention to provide a unique process for forming a truly reverse image mask.

Another object of the present invention is to provide a reverse image masking technique which allows the formation of truly self-aligned twin wells.

Still another object of the present invention is to provide a single photolithographic step, reverse masking technique which produces self-aligned twin wells.

These and other objects of the invention are attained by forming a first mask of a first material on a substrate and introducing first conductivity type impurities to form a first well region in the substrate. This is followed by applying a second mask layer of a second material to at least fill the openings in the first mask and cover the first mask. The second mask layer is removed sufficiently to reveal at least a portion of the first mask. The first mask with any superimposed mask layer material is selectively removed to form a second mask being the reverse image of the first mask. Second conductivity type impurities are introduced through openings in the second mask to form second wells aligned with the first well regions. The removal of the second mask material to reveal the first mask material may be achieved by removing the second mask layer to reveal at least the edges of the openings in the first mask layer. This reduces the amount of removal processing. Alternatively, a planarization layer may be provided over the second mask layer and the planarization layer and the second mask layer are removed down to a level to totally reveal the first mask layer which is then selectively removed.

The two mask layers must be of materials with sufficiently different characteristics such that they may be selectively removed. For example, the two mask layers may be selected from positive and negative photosensitive resist materials or a photoresist material and a metallic material. Where two types of photosensitive resist material are used, the first mask is formed using a positive photosensitive resist wherein the mask layer is the unexposed portion after developing. After the introduction of impurities, and before the application of the second mask material, the remaining first mask is radiation treated to form a hardened first mask layer. The second mask layer, after being applied, is removed to reveal at least portions of the first mask material which is then selectively removed with any superimposed portion of the second mask layer thereon. This forms the inverse mask. The second mask material may either be a positive or negative photoresist mask since the radiation treated and hardened portion of the first mask can be selectively removed even with the same photosensitive resist material used in the second layer. If it is negative photosensitive resist, radiation treatment may not be necessary.

Other objects, advantages and novel features of the present invention will become apparent from the following detailed description of the invention when considered in conjunction with the accompanying drawings.

DETAILED DESCRIPTION OF THE DRAWINGS

Figure 1:
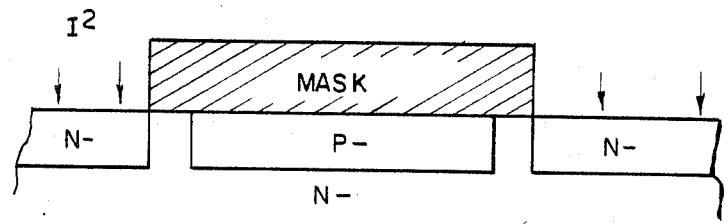
FIG. 1 illustrates the second mask of a two photolithographic process of the prior art.
Figure 2:
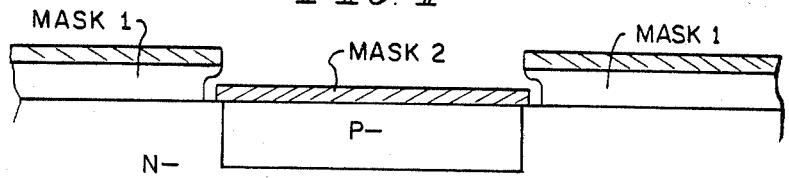
FIG. 2 illustrates one stage in the formation of the second mask using a single photolithographic process of the prior art.
Figure 3:
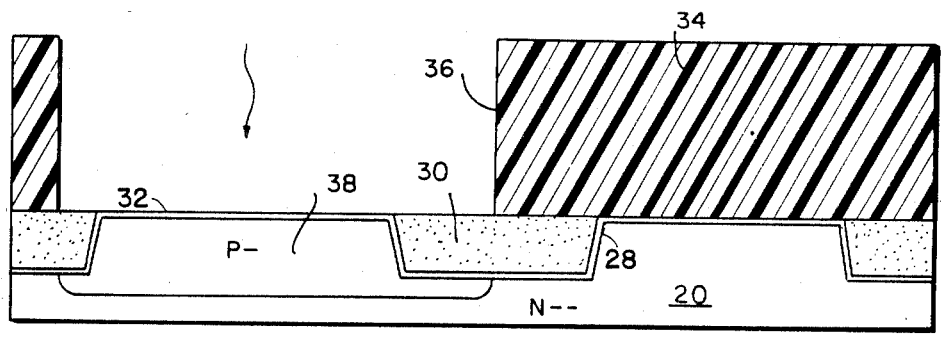
FIGS. 3-6 illustrate a first method of forming an inverse mask incorporating the principles of the present invention.

The process of fabrication begins as illustrated in FIG. 3 with a substrate 20, which for purposes of example will be an N-conductivity type silicon having an impurity concentration in the range of $10^{15}$ atoms per cubic centimeter. The substrate 20 may be an original substrate or may be an epitaxial layer formed on another substrate layer. The substrate is processed to form lateral dielectric isolation regions which may be deposited polycrystalline silicon or silicon dioxide separated from the substrate 20 by a thermal oxide layer 28. A thermal oxide layer 32 is formed on the substrate 20. The lateral isolation region 30 are shown in the FIGS. 1-8 as an example of a type of substrate on which the present processes may be used, but the present processes may also be performed on substrates without lateral dielectric isolation.

The next sequence of steps produce self-aligned twin wells in which the field effect transistor devices for example can be formed. This process involves using a first mask and then forming a second mask which is the inverse image of a first mask. A first masking material 34, for example a photoresist or a polyimide, is formed on the surface of the substrate 20. A pattern is formed on the first masking material 34 by exposing it to a pattern and selectively removing the exposed or unexposed portions, depending upon the type of photoresist material used, to form opening 36 in the mask 34 to expose the areas in which the P-wells are to be formed. A P-type impurity, for example boron, is ion implanted at sufficient energy level and dose to form the P- well 38 illustrated in FIG. 3 having an impurity concentration greater or equal to $10^{16}$ atoms per cubic centimeter and a depth of, for example, 15,000 Angstroms in mesa areas and 5000 Angstroms in oxide filled areas. The photoresist layer 34 generally has a thickness in the range of 10,000 to 20,000 Angstroms. Additional boron implants can optionally be done at this time, using different doses and energies, to create a tailored impurity doping concentration for the P- for device requirements.

Figure 4:
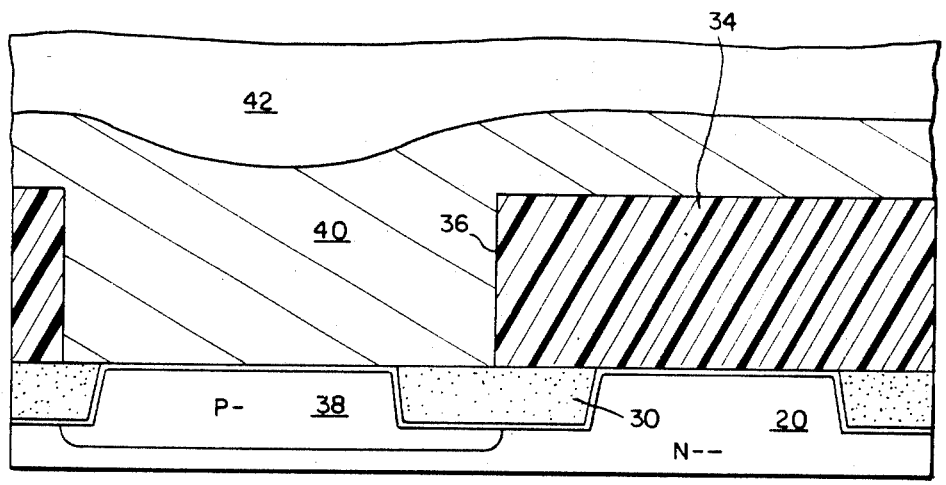
Figure 5:
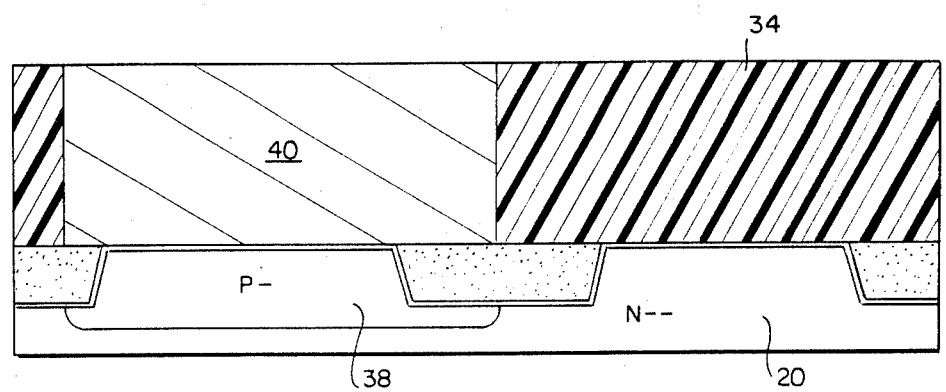
Figure 6:
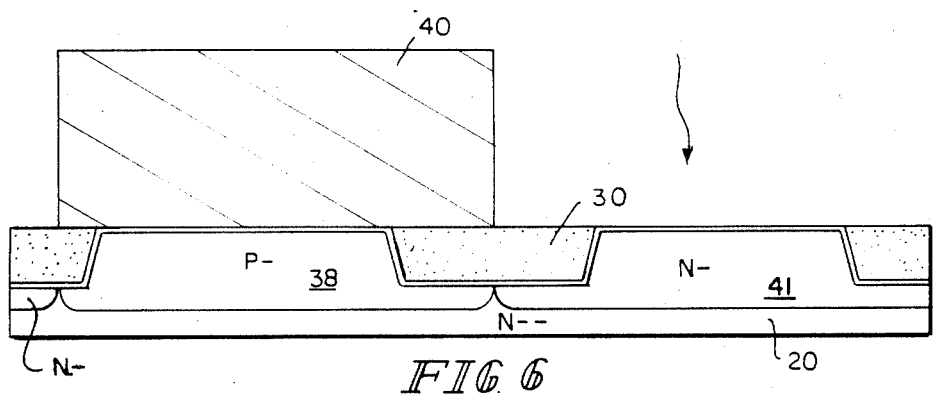

The formation of the second mask includes applying a second mask layer 40, for example metal, which fills the previous opening 36 in the first mask layer 34. The mask layer 40 is then planarized by applying a planarization layer 42 which may be, for example a photoresist or polyimide layer. By way of example, the mask layer 40 which may be aluminum, is formed to have a thickness of 10,000 to 20,000 Angstroms on the surface of the first masking layer 34 and the planarization layer 42 has a thickness above the planar part of the aluminum layer in the range of 10,000 to 20,000 Angstroms. The resulting structure is illustrated in FIG. 4. The planarization process includes etching the planarization layer 42 and the aluminum layer 40 at appropriate rates such that the resulting aluminum layer 40 is planar with the top of the first mask layer 34 as illustrated in FIG. 5. This may be accomplished by reactive ion etching using the appropriate gas and energy level to accomplish planarization. Planarization techniques are well known in the prior art and thus will not be described herein in detail. The first mask layer 34 is then selectively removed by an appropriate wet or dry etchant. This results in a mask layer 40 which is the inverse image of the original mask layer 34 as illustrated in FIG. 6.

N-type impurities, for example phosphorous, are then introduced for example, by ion implantation to form the N- well 41. The N- well 41 which is aligned with the previously formed P-well 38 has an impurity concentration of equal to or greater than $10^{16}$ atoms per cubic centimeter and a depth of 15,000 Angstroms. The second mask layer 40 is removed and the substrate is annealed.

The described process forms a pair of masks, one the inverse of the other wherein the edges of the mask openings are aligned. This permits the formation of self-aligned wells with little, if any, overlap. As discussed in the Background of the Invention, any dual photolithographic technique as FIG. 1 requires lateral spacing because of the tolerances of the lithographic processes to assure no overlap of the formed regions. Similarly, prior single lithographic techniques, as illustrated in FIG. 2 could not truly form inverse masks and, thus, also must either allow lateral spacing or provide guard rings. The self-aligned dual well 38 and 41 remove the need for separate guard rings. Thus, removing additional steps to form the guard rings. It should be noted that by using ion implantation to form the wells, very little side diffusion occurs and therefore the spacing between the devices may be reduced. Similarly, very high peak doping results which reduces the latch-up problem as well as providing the capability to form high threshold isolation field effect transistors. The resulting well's surface doping also results in relatively low junction capacitance.

Figure 7:
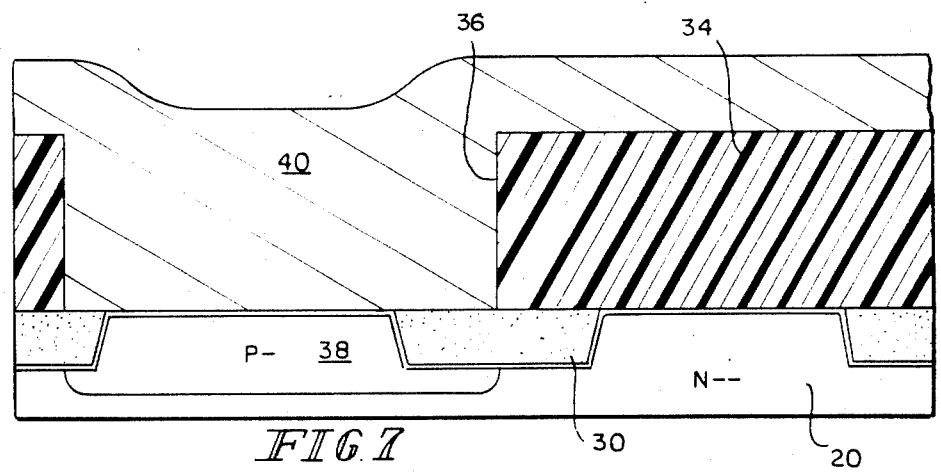
FIGS. 7 and 8 illustrate a second method of forming an inverse mask according to the principles of the present invention.
Figure 8:
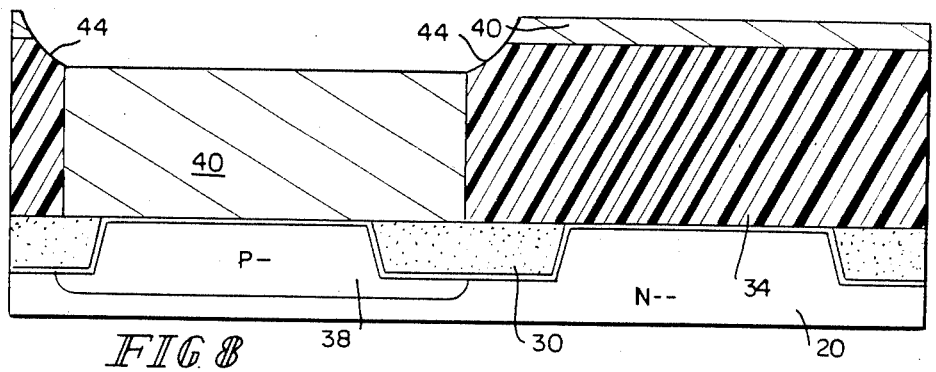

A first alternative method of forming the second mask layer which is the inverse of the first mask layer includes forming the second mask layer 40 to a sufficient depth to fill the opening 36 in the first mask layer 34 as illustrated in FIG. 7. For a first mask layer 34 having a thickness of 10,000 to 20,000 Angstroms, the second mask layer 40 would have a thickness on the first mask layer 34 of 10,000 to 20,000 Angstroms. The second mask layer 40 is then etched using either wet or dry etch until a portion of the first mask layer 34 is revealed. Since only a single layer is being etched, the etch rate is uniform and the corners of the opening 36 will become revealed because of the topology of the second mask layer 40. As illustrated in FIG. 8, edge 44 of mask layer 34 is revealed and partially etched. The first mask layer 34 is then selectively removed using a wet etchant which not only removes the first mask layer 34, but does remove the portions of the second mask layer 40 which are superimposed thereon. This lift-off technique results in the same second mask layer 40 of FIG. 6 having inverse image of the mask layer 34 of FIG. 3.

Since the first alternative inverse mask forming process does not attempt to form a planar surface before etchings, the deposited second layer may be substantially thinner with a pronounced indenture. This reduces the time and cost of applying and etching the second mask layer.

Figure 9:
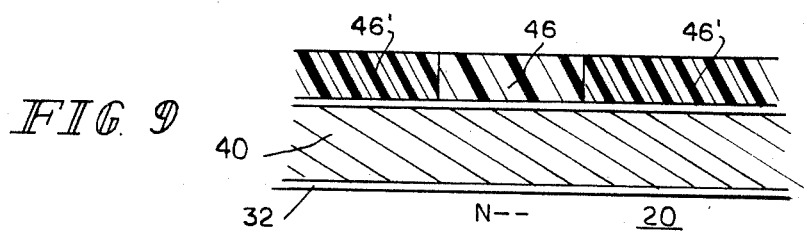
FIGS. 9-14 illustrate a third method of forming an inverse mask according to the principles of the present invention.
Figure 10:
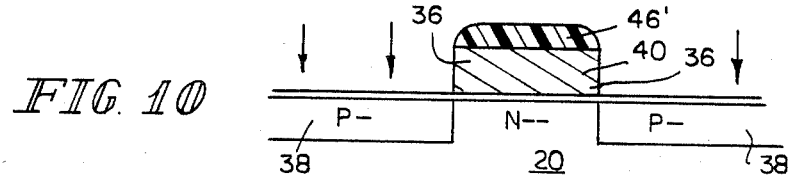

A second alternative to forming the inverse mask is illustrated in FIGS. 9–14. To contrast it with the first two methods, it will be noted that the first mask material will be a metal mask for example, aluminum, and the second mask material will be the photoresist mask. Also, it will be noted that the technique is used on a substrate having no lateral dielectric isolation. The process begins by forming a first masking layer for example, a metal layer 40, on the top surface of the substrate 20 and separated therefrom by a thin oxide layer 32. A thin photoresist material 46 having a thickness in the range of 5,000 to 15,000 Angstroms is then applied to the metal 40 and exposed to a desired pattern to form exposed regions 46' and unexposed regions 46. The structure is illustrated in FIG. 9. The exposed portions 46' are then removed by a positive developer. The process so far has been described for a positive photoresist wherein the exposed portions are removed. The unexposed photoresist layer 46 is then used as a mask for the removal by etching of the metal layer 40. This etching may be performed by wet or dry etching as well as reactive ion etching. If a wet etch is used, the resultant side walls should be vertical to preserve the self-aligning effect. The resulting structure as illustrated in FIG. 10 is a two-layer mask having photoresist portion 46 and metal portion 40. P type impurities for example, boron as described above are introduced using the first mask layer as an alignment mask to form the P- wells 38.

Figure 11:
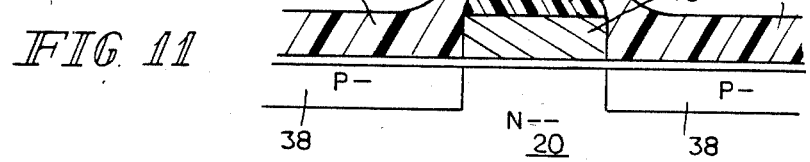

Prior to the application of the second masking level, the photoresist layer 46 is exposed to for example, deep ultraviolet light to form a hard exposed photoresist. Depending upon the specific second mask material, the hardening step may not be necessary to prevent intermixing of the photoresists. This exposure may take place any time after the selective removal of the previous exposed portions 46 of FIG. 9 and the application of the second mask layer. The second mask layer 34 is applied as illustrated in FIG. 11. For example, a second mask layer may be a negative photoresist material. Using the techniques of FIGS. 7 and 8, the second photoresist material is applied to a sufficient thickness so as to at least fill the openings 36 in the first mask level. This height should be at least to the height of the first mask level 40 and preferably to the combination of the height of the first mask level 40 and the photoresist level 46'.

Figure 12:
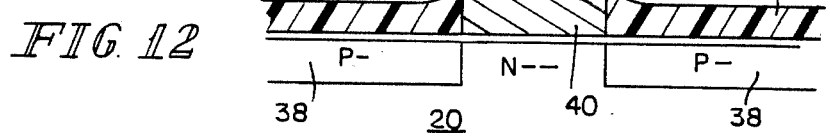
Figure 13:
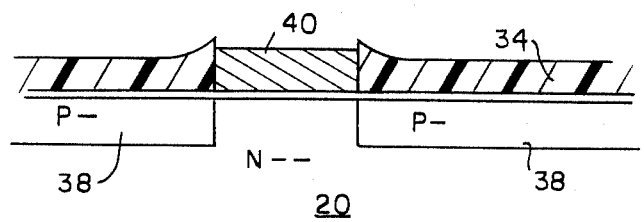

The second mask level 34 is removed until the edges 48 of the photoresist layer 46' are revealed as illustrated in FIG. 12. The photoresist layer 46' is then selectively removed using an appropriate wet or dry etchant and the superimposed portion of the second photoresist layer 34 is also removed. The resulting structure is illustrated in FIG. 13 wherein the first mask level 40 is surrounded laterally by the second mask level 34. The first mask level 40 may be selectively removed resulting in the mask of FIG. 14. N type impurities for example, phosphorus are introduced to form the N- well region 41.

Figure 14:
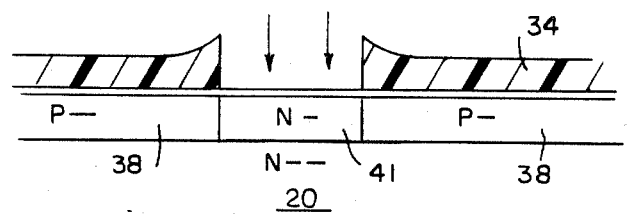
Figure 15:
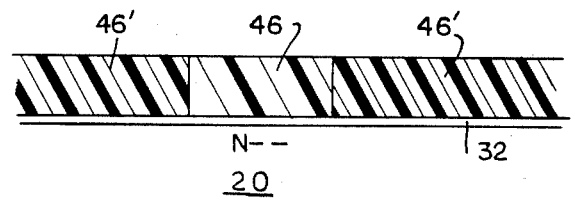
FIGS. 15-18 illustrate a fourth method of forming an inverse mask according to the principles of the present invention.
Figure 16:
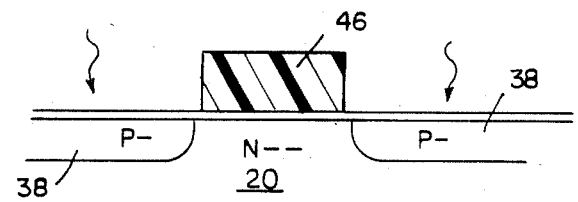
Figure 17:
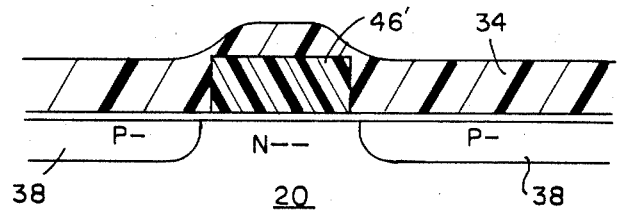
Figure 18:
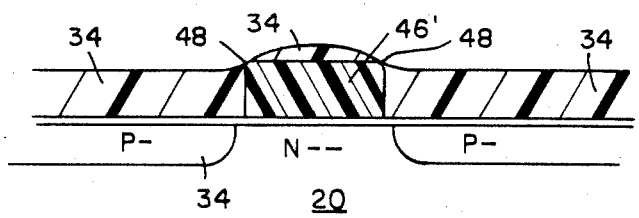

The process for FIGS. 9–14 may also be performed using two photoresist masks and eliminating the metal layer 40. As illustrated in FIG. 15, the first photoresist mask 46 is applied and patterned to form exposed areas 46' and unexposed portions 46. The exposed portions 46' are removed and P type impurities are implanted to form P- well regions 38 as illustrated in FIG. 16. The unexposed portion 46 is then exposed to ultraviolet rays and a second masking material 34 is applied thereon as illustrated in FIG. 17. The second masking layer is etched back to reveal edges 48 of the first masking layer 46' as illustrated in FIG. 18. The first masking layer 46' is removed leaving the second masking layer 34 which is the inverse mask of the original mask 46'. The process is completed as illustrated in FIG. 14.

The processes for FIGS. 9–14 use a positive photoresist as a first masking layer and a negative photoresist as the second masking layer. This is the preferred embodiment since the positive photoresist, having an exposed pattern more easily removed than the unexposed pattern, allows for a subsequent exposure step prior to the formation of the second mask. This exposure step will prevent and reduce intermixing of the positive and negative photoresist to assure a true inverse masking operation. Depending upon the photoresist material used, the exposure hardening step may be deleted.

It should be noted that the photoresist material forming the second mask is never exposed so as to change character since it is used as an impurity introduction mask patterned by a lift-off style technique. Thus, a single photoresist material may be used for both the first and second mask. For example, the first mask 46 may be a positive photoresist wherein the exposed portions are removed by developer and followed by ion implantation. The unexposed portion is then exposed and new positive photoresist material may be applied to form the region 34. Since the first mask region 46' is an exposed photoresist, it has different characteristics than the unexposed second positive photoresist layer 34 and, thus, they can be selectively removed by developer.

The present process may be performed with any combination of photoresist as long as they have sufficiently different characteristics such that the first mask can be selectively removed with the overlying second mask.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A method of fabricating self-aligned regions in a substrate comprising:
   forming a first mask on a first material on said substrate with at least one opening therein;
   introducing impurities of a first conductivity type into said substrate through said opening in said first mask to form a first well region;
   applying a second mask layer of a second material to at least fill said opening in said first mask and covering said first mask;
   removing said second mask layer sufficient to reveal at least a portion of said first mask;
   selectively removing said first mask with any superimposed second mask layer to form a second mask being the reverse image of said first mask; and introducing impurities of a second conductivity type into said substrate through openings in said second mask to form second well regions aligned with said first well regions.

2. A method according to claim 1 wherein said first and second materials are different photosensitive resist materials.

3. A method according to claim 1 wherein said first material is either a photosensitive resist material or a metallic material and said second material is the other material.

4. A method according to claim 1 wherein said impurity introducing steps are ion implantation.

5. A method according to claim 1 wherein said first and second mask are formed to have a thickness in the range of 10,000 to 20,000 Angstroms.

6. A method according to claim 1 wherein removing said second mask layer includes reactive ion etching.

7. A method according to claim 1 wherein removing said second mask layer is performed sufficient to reveal said first mask at the edge of said opening.

8. A method according to claim 1 wherein said second mask layer is applied to a thickness substantially equal to the thickness of said first mask.

9. A method according to claim 2 wherein said first material is a positive photosensitive resist material and said second material is a negative photosensitive resist material.

10. A method according to claim 6 wherein removing said first mask layer includes chemical etching.

11. A method of fabricating self-aligned regions in a substrate comprising:
  forming a first mask of a first material on said substrate with at least one opening therein;
  introducing impurities of a first conductivity type into said substrate through said opening in said mask to form a first well regions;
  applying a second mask layer of a second material overfilling said opening in said first mask and covering said first mask;
  applying a planarization layer of a third material over said second mask layer to provide a substantially planar top surface;
  removing said planarization layer and second mask layer sufficient to reveal said first mask;
  selectively removing said first mask to form a second mask, the reverse image of said first mask; and
  introducing impurities of a second conductivity type into said substrate through openings in said second mask to form second well regions aligned with said first well regions.

12. A method according to claim 11 wherein said first and third materials are a photosensitive resist material and said second material layer is a metallic material.

13. A method according to claim 11 wherein said impurity introducing steps are ion implantation.

14. A method according to claim 11 wherein said first and second mask are formed to have a thickness in the range of 10,000 to 20,000 Angstroms.

15. A method according to claim 11 wherein removing said second mask layer includes reactive ion etching.

16. A method according to claim 15 wherein removing said first mask layer includes chemical etching.

17. A method of fabricating self-aligned regions in a substrate comprising:
  applying a first mask layer of a first material on a substrate;
  forming a second mask layer of a second material on said first mask layer with at least one opening therein;
  removing a portion of said first mask layer in said second mask layer opening to form an opening to reveal said substrate;
  introducing impurities of a first conductivity type into said substrate through said opening in said first and second mask to form a first well region;
  applying a third mask layer of a third material to at least fill said opening in said first mask;
  removing said third mask layer until a portion of said second mask is revealed;
  selectively removing said second mask with any superimposed third layer to reveal said first mask layer;
  selectively removing said first mask to form a second mask, the reverse image of said first mask; and
  introducing impurities of a second conductivity type into said substrate through openings in said second mask to form second well regions aligned with said first well regions.

18. A method according to claim 17 wherein said first and third mask layers are formed to have substantially the same thickness and said second mask layer is formed to be substantially thinner than said first mask layer.

19. A method according to claim 17 wherein said second material is a positive photosensitive resist material and including exposing said second mask layer after forming said opening in said first mask layer and before applying said third layer.

20. A method according to claim 17 wherein said impurity introducing steps are ion implantation.

21. A method according to claim 17 wherein removing said third mask layer includes reactive ion etching.

22. A method according to claim 17 wherein removing said third mask layer is performed sufficient to reveal said second mask at the edge of said opening.

23. A method according to claim 17 wherein said third layer is applied to a thickness substantially equal to the thickness of said first mask layer.

24. A method according to claim 18 wherein said first and third mask are formed to have a thickness in the range of 10,000 to 20,000 Angstroms and said second mask is formed to have a thickness in the range of 5,000 to 15,000 Angstroms.

25. A method according to claim 19 wherein said first material is a metallic material and said third material is a negative photosensitive material.

26. A method of fabricating self-aligned regions in a substrate comprising:
  applying a first mask layer of photosensitive resist material;
  exposing said first mask layer to a pattern to form exposed and unexposed areas in said first layer;
  selectively removing said exposed areas to form a first mask having at least one opening therein;
  introducing impurities of a first conductivity type into said substrate through said opening in said mask to form a first well region;
  exposing said first mask to form only exposed portions;
  applying a second mask layer of a photosensitive resist material to at least fill said opening in said first mask and covering said first mask;
  removing said second mask layer sufficient to reveal at least portions of said first mask;

selectively removing said first mask with any superimposed second mask layer to form a second mask being the reverse image of said first mask; and introducing impurities of a second conductivity type into said substrate through openings in said second mask to form second well regions aligned with said first well regions.

27. A method according to claim 26 wherein said first mask is formed of a positive photosensitive resist material and said second mask is formed of a negative photosensitive resist material.

28. A method according to claim 26 wherein said first and second masks are formed of the same photosensitive resist material.

* * * * *